(12) United States Patent
Bach

(10) Patent No.: US 7,394,128 B2
(45) Date of Patent: Jul. 1, 2008

(54) SEMICONDUCTOR MEMORY DEVICE WITH CHANNEL REGIONS ALONG SIDEWALLS OF FINS

(75) Inventor: Lars Bach, Ullersdorf (DE)

(73) Assignee: Infineon Technologies AG, Munich (DE)

( * ) Notice: Subject to any disclaimer, the term of this patent is extended or adjusted under 35 U.S.C. 154(b) by 7 days.

(21) Appl. No.: 11/304,062

(22) Filed: Dec. 15, 2005

(65) Prior Publication Data

US 2007/0138516 A1    Jun. 21, 2007

(51) Int. Cl.
*H01L 27/108* (2006.01)

(52) U.S. Cl. .................. 257/324; 257/239; 257/278; 257/E21.014; 257/288; 257/E29.309

(58) Field of Classification Search .......... 257/288, 257/E27.084, 324, E29.309, E21.014, 239, 257/278

See application file for complete search history.

(56) References Cited

U.S. PATENT DOCUMENTS

| | | | |
|---|---|---|---|
| 6,657,252 B2 * | 12/2003 | Fried et al. ............... | 257/316 |
| 6,861,685 B2 * | 3/2005 | Choi ........................ | 257/288 |
| 7,227,234 B2 * | 6/2007 | Roizin et al. ............. | 257/393 |
| 2004/0207001 A1 * | 10/2004 | Kouznetsov et al. ...... | 257/314 |
| 2005/0260814 A1 | 11/2005 | Cho et al. | |
| 2006/0071259 A1 * | 4/2006 | Verhoeven ................ | 257/299 |

* cited by examiner

*Primary Examiner*—Eugene Lee
*Assistant Examiner*—Mohammad Timor Karimy
(74) *Attorney, Agent, or Firm*—Slater & Matsil, L.L.P.

(57) ABSTRACT

A semiconductor memory (26) having a plurality of memory cells (25), the semiconductor memory (26) having a substrate (1), at least one wordline (2) and first (3) and second lines (4). Each memory cell (25) of the plurality of memory cells (25) includes a fin (15) of semiconductor material, the fin (15) having a top surface (5), first (6) and second (7) opposing sidewalls and first (8) and second (9) opposing ends. The fin (15) extends along a first direction (X). Each memory cell (25) also includes a charge-trapping layer (11) disposed on the first (6) and second (7) sidewalls of said fin (15), a patterned first insulating layer (10) disposed on the top surface (5) of the fin (15), wherein the first insulating layer (10) abuts the top surface (5) of the fin (15) and the charge-trapping layer (11). Each memory cell (25) also includes a first doping region (12) coupled to the first end (8) of said fin (15) and a second doping region (13) coupled to the second end (9) of the fin (15).

30 Claims, 11 Drawing Sheets

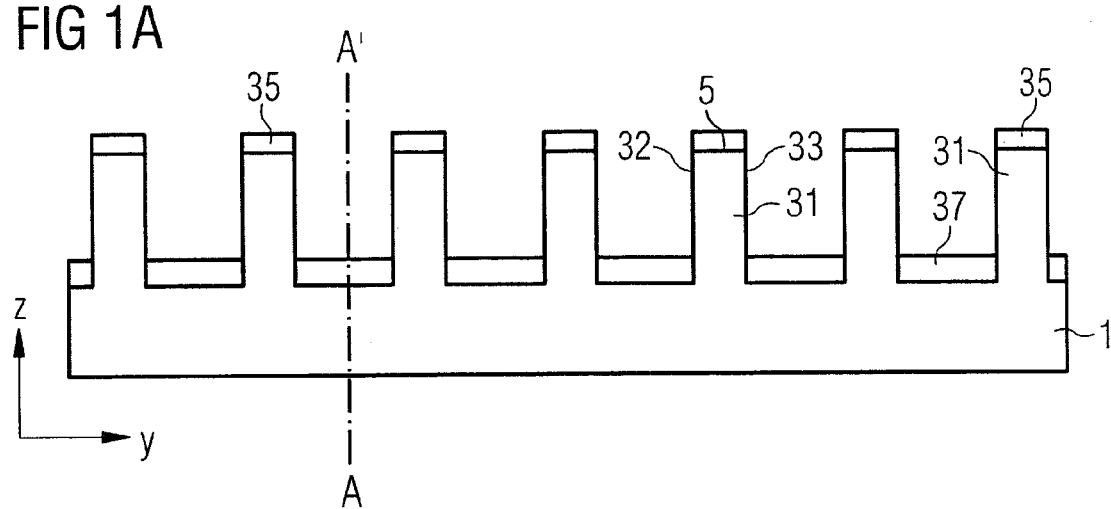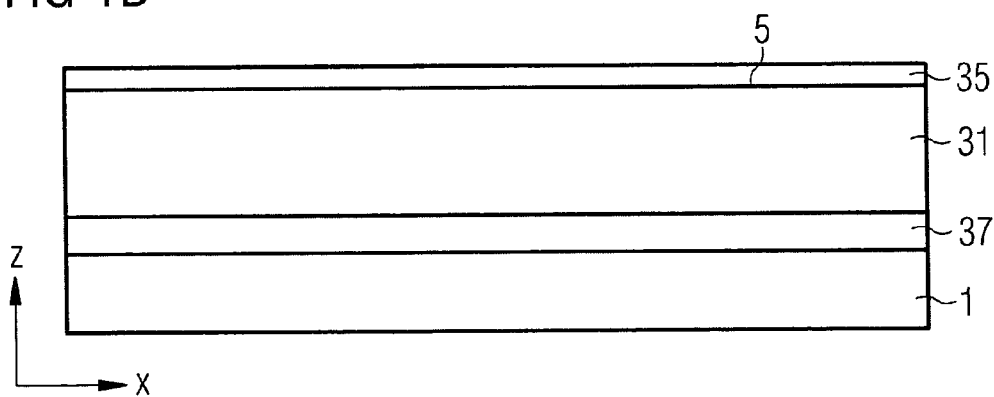

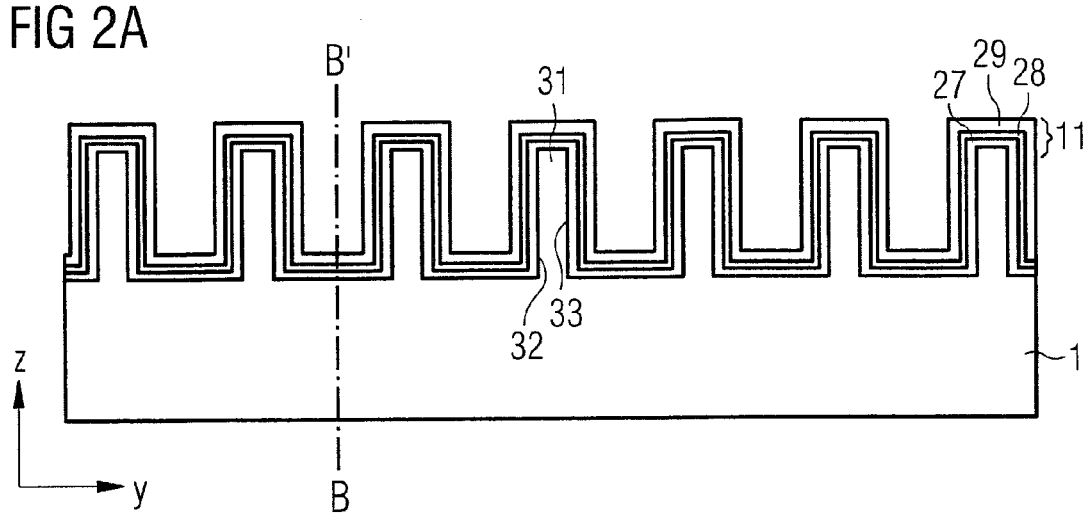
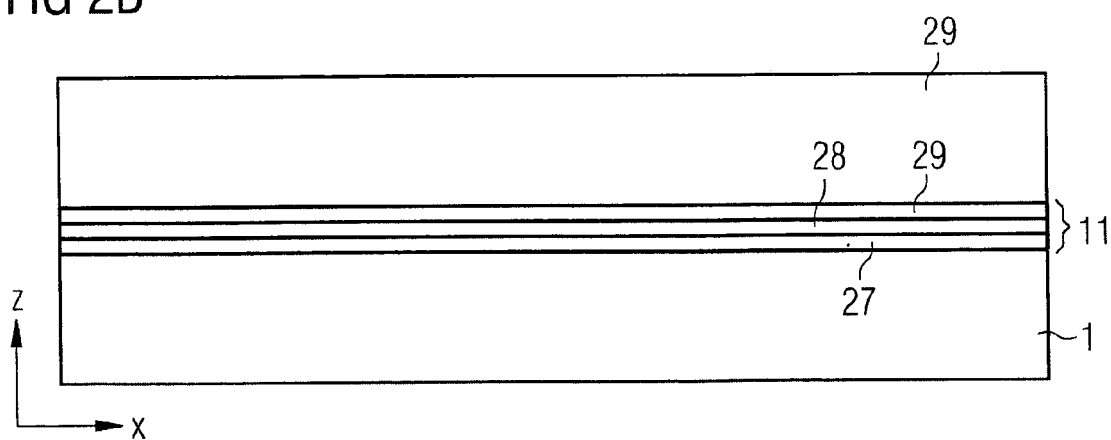

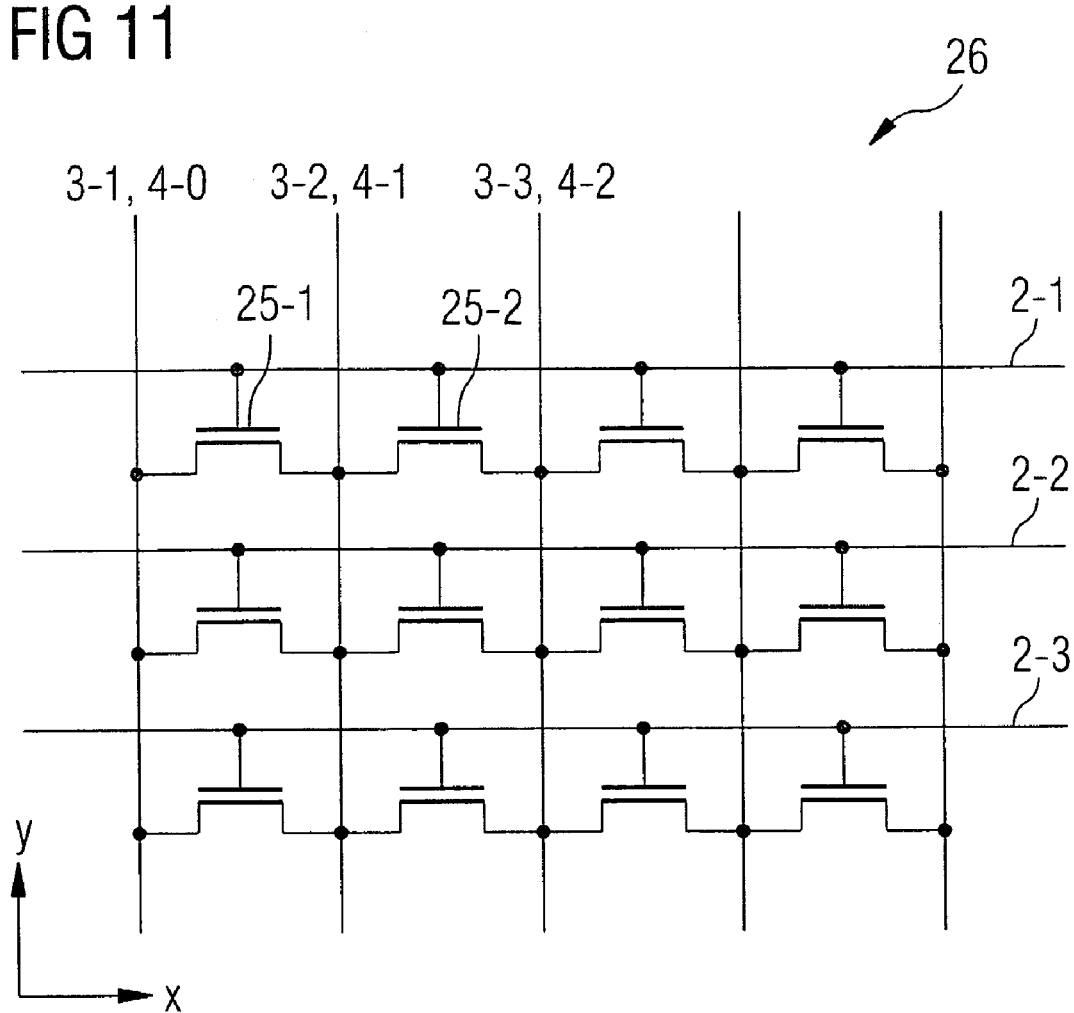

SEMICONDUCTOR MEMORY DEVICE WITH CHANNEL REGIONS ALONG SIDEWALLS OF FINS

TECHNICAL FIELD

The present invention relates generally to semiconductor memory devices and more particularly to flash memories.

BACKGROUND

Flash memory devices are widely used as non-volatile memory elements. Flash memories can be classified into a stacked gate flash cell type and a SONOS (polysilicon-oxynitride-oxide-semiconductor) flash cell type. The stacked gate flash cell type has a stack structure including a floating gate, source, drain, a channel region disposed between the source and the drain, and a control gate. The SONOS flash cell type comprises a gate dielectric including an ONO-stack and a gate disposed thereon.

The basic principle of storing information in the stacked gate flash cell type is that a turn-on voltage $V_{TH}$ of the control gate can be shifted by depositing charges locally in the floating gate. Typically, the charges are deposited in the floating gate by applying a voltage potential to the gate and to the drain and thereby inducing tunnelling of hot carriers from the channel region through the tunnelling oxide film into the floating gate. Since the floating gate is electrically floating, the carriers are trapped in the floating gate. However, defects in the tunnelling oxide underneath the conductive floating gate may cause leakage of the device.

In comparison to the stacked gate flash cell type, a charge-trapping layer is used in the SONOS flash cell type to confine the carriers between the gate and the channel. A charge-trapping layer may, for example, comprise silicon nitride. The charge-trapping layer includes traps, effecting that the charges are not evenly distributed in the charge-trapping layer, but that the charges are localized in a certain region of the charge-trapping layer. Therefore, the SONOS flash cell type is less sensitive to defects in the tunneling oxide layer.

For achieving higher integration, the gate length of the SONOS flash cell type needs to be reduced. With decreasing gate length the performance of the SONOS flash cell is adversely affected by short channel effects that may cause malfunction of the SONOS flash cell. Therefore, the scaling properties of the conventional SONOS flash cell type is limited. What is desired is a non-volatile memory cell type with improved scaling properties.

SUMMARY OF THE INVENTION

One embodiment of the present invention provides a semiconductor memory that has a multitude of memory cells. The semiconductor memory has a substrate, at least one wordline and first and second lines. Each memory cell of the multitude of memory cells comprises a fin of semiconductor material, the fin having a top surface, first and second opposing sidewalls, and first and second opposing ends. The fin extends along a first direction. Each of the memory cells further comprises a charge-trapping layer disposed on the first and second sidewalls of the fin, and a patterned first insulating layer disposed on the top surface of the fin. The first insulating layer abuts the top surface of the fin and the charge-trapping layer. Each memory cell further comprises a first doping region coupled to the first end of the fin and a second doping region coupled to the second end of the fin. The at least one wordline covers the first insulating layer disposed on the top surface of the fin and the first conductive layer covers the charge-trapping layer disposed on the first and second sidewalls of the fin. The at least one wordline extends along the first direction. The first and second lines extend along a second direction that is different from the first direction.

Another aspect of the present invention provides a method for forming a semiconductor memory. The method comprises providing a substrate, patterning the substrate to form ridges and areas of the substrate disposed between the ridges. The ridges each have a respective top surface and a respective first and second opposed sidewall. The ridges extend along a first lateral direction and the areas of the substrate extend along the first direction. The method further comprises forming a charge-trapping layer at least on each first and second opposed sidewalls of each of the ridges, oxidizing the top surfaces of each of the ridges, thereby forming a first insulating layer on the top surfaces of each of the ridges. The method further comprises forming wordlines on each of the ridges, wherein each wordline covers the first insulating layer and the charge-trapping layer of the respective ridge.

Another aspect of the present invention provides a memory cell disposed on a substrate. The memory cell comprises a fin of semiconductor material. The fin has a top surface, first and second opposing sidewalls and first and second opposing ends. The fin extends along a first direction. A charge-trapping layer is disposed on the first and second sidewalls of the fin. A patterned insulating layer is disposed on the top surface of the fin, wherein the insulating layer abuts the top surface of the fin and the charge-trapping layer.

Another aspect of the present invention provides a method for forming a memory cell. The method comprises providing a substrate, patterning the substrate to form a fin, wherein the fin has a top surface and a first and second opposed sidewall. The method further comprises forming a charge-trapping layer at the first and second opposed sidewall of the fin, oxidizing the top surface of the fin, thereby forming an insulating layer on the top surface of the fin. The method further comprises forming a conductive layer on the fin, the conductive layer covering the insulating layer and the charge-trapping layer of the fin.

BRIEF DESCRIPTION OF THE DRAWINGS

For a more complete understanding of the present invention, and the advantages thereof, reference is now made to the following descriptions taken in conjunction with the accompanying drawing, in which:

FIGS. 1A to 9C are cross-sectional views illustrating a process flow for the fabrication of a semiconductor device according to one embodiment of the present invention;

FIG. 11 depicts a schematic view of a wiring layout of a semiconductor device according to one embodiment of the present invention.

Figure 3A:
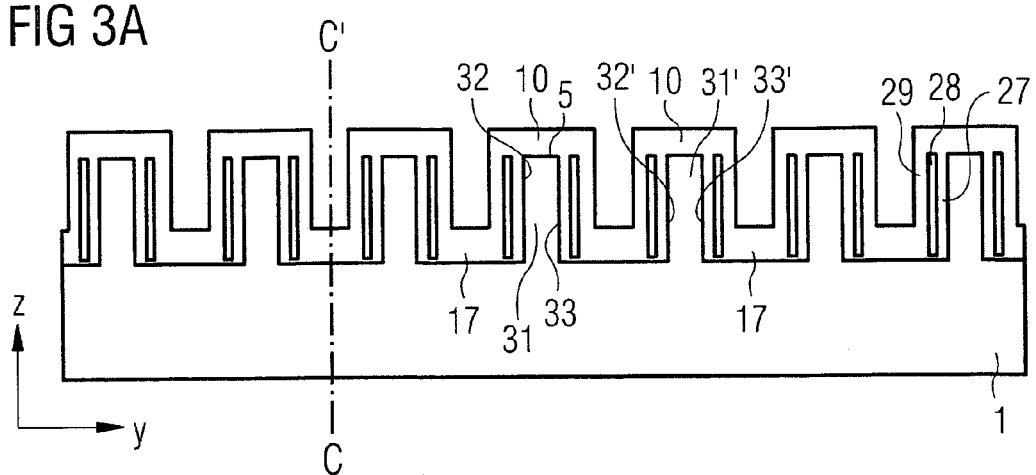

The following list of reference symbols can be used in conjunction with the figures:
1 Substrate
2 Wordline
3 Line
4 Line
5 Top surface of fin
6 Sidewall of fin
7 Sidewall of fin
8 End of fin
9 End of fin 10 Insulating layer
11 Charge-trapping layer
12 Doping region
13 Doping region
14 Conductive layer
15 Fin
16 Isolation trench
17 Insulating layer
18 Line-shaped layer
19 Line-shaped layer
20 Line-shaped layer
21 Line-shaped layer
22 Isolation trench filling
23 Isolation filling
24 Conductive layer
25 Memory cell
26 Semiconductor memory
27 Dielectric layer
28 Dielectric layer
29 Dielectric layer
31 Ridge
32 Sidewall of ridge
33 Sidewall of ridge
34 Third conductive layer
35 Hardmask
36 Hardmask
37 Spacer
38 Hardmask

DETAILED DESCRIPTION OF ILLUSTRATIVE EMBODIMENTS

FIG. 1A depicts a cross-sectional view of a semiconductor device according to one embodiment of the present invention in a stage of the production process. FIG. 1B depicts a cross-sectional view of the semiconductor device depicted in FIG. 1A along the cutting line AA' depicted in FIG. 1A.

Referring to FIGS. 1A and 1B concurrently, a substrate 1, preferably a p-type semiconductor substrate is provided. The substrate 1 can be a bulk semiconductor substrate or a semiconductor on insulator (SOI) substrate. The substrate 1 is patterned to form ridges 31 and areas of the substrate 1 disposed between the ridges 31. Each of the ridges 31 has a top surface 5 and a first 32 and a second 33 opposed sidewall. The ridges 31 extend along a first direction X that extends perpendicular to the Y-Z-plane spanned by the Y-direction and the Z-direction as depicted in the coordinate system of FIG. 1A.

Patterning the substrate 1 may include the deposition of a first hardmask 35 on the substrate 1, patterning the first hardmask 35 by means of photolithography and etching the first hardmask 35 to form stripes of the first hardmask extending along the X-direction. The first hardmask 35 comprises a material that can be selectively etched with regard to the underlying substrate 1. The first hardmask 35 preferably comprises silicon nitride. Thereafter, the substrate 1 is etched selectively with respect to the first hardmask 35 to form ridges 31 extending along the X-direction.

Then dopants such as boron are introduced into the substrate 1 in areas 37 not covered by the first hardmask 35. The dopants may be introduced into the substrate 1 by an implantation process. The implantation of dopants into the areas 37 of the substrate 1 disposed between the ridges 31 serves for suppressing a channel formation beneath the ridges 31.

FIG. 2A depicts a cross-sectional view of the semiconductor device as depicted in FIG. 1A in another stage of the production process, wherein the doped area 37 of the substrate 1 is not shown. FIG. 2B depicts a cross-sectional view of the semiconductor device as depicted in FIG. 2A along the cutting line BB' depicted in FIG. 2A.

Referring to FIGS. 2A and 2B, the first hardmask 35 is removed from the top surfaces 5 of each of the ridges 31, and a charge-trapping layer 11 is formed on the top surfaces 5 of each of the ridges 31, on the first 32 and second 33 opposing sidewalls of each of the ridges 31 and on the areas of the substrate 1 disposed between the ridges 31.

The formation of the charge-trapping layer 11 may include the formation of a first dielectric layer 27 on the top surfaces 5 of each of the ridges 31, on the first 32 and second 33 opposing sidewalls of each of the ridges 31 and on the areas of the substrate 1 disposed between the ridges 31.

Furthermore, the formation of the charge-trapping layer 11 may include the formation of a second dielectric layer 28 on the first dielectric layer 27 and the formation of a third dielectric layer 29 on the second dielectric layer 28.

The first dielectric layer 27 serves as a tunneling dielectric layer and may comprise silicon oxide, aluminum oxide, tantalum pentoxide, or another suited tunneling dielectric layer having a high dielectric constant. A first dielectric layer 27 comprising silicon oxide may be formed by thermally oxidizing the top surface 5 and the first 32 and second 33 sidewalls of each of the ridges 31 and the areas of the substrate 1 disposed between the ridges 31.

The second dielectric layer 28 serves for trapping charges and comprises traps, in which charges can be stored. The second dielectric layer 28 may comprise silicon nitride or silicon oxy-nitride or another material that can trap charges. A second dielectric layer 28 comprising silicon nitride may be formed by depositing a silicon nitride film on the first dielectric layer 27. The second dielectric layer 28 may be deposited by chemical vapor deposition or other suitable deposition techniques.

The third dielectric layer 29 serves to isolate the second dielectric layer 28 and the subsequently formed first conductive layer 14 (not shown in FIGS. 2A and 2B). The third dielectric layer 29 may comprise silicon oxide, aluminum oxide or tantalum pentoxide or any other suited material having a high dielectric constant. The third dielectric layer 29 may be formed by a chemical vapor deposition method.

Figure 3B:
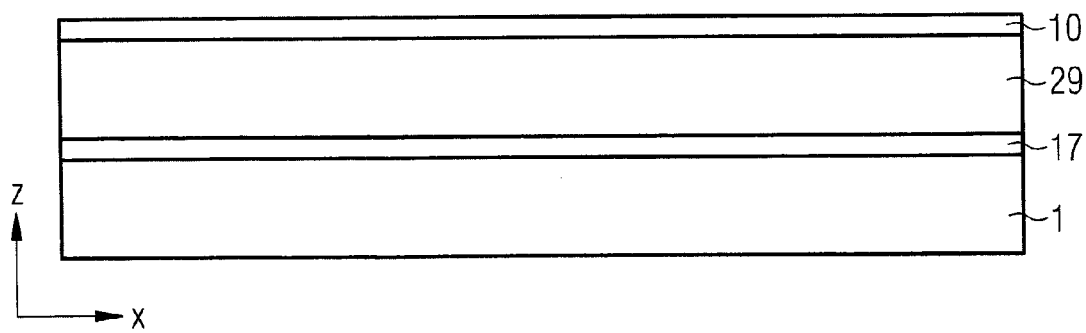

FIG. 3A depicts a cross-sectional view of the semiconductor device as depicted in FIG. 2A in another stage of the production process. FIG. 3B depicts a cross-sectional view of the semiconductor device as depicted in FIG. 3A along the cutting line CC' depicted in FIG. 3A.

Referring to FIGS. 3A and 3B, the charge-trapping layer 11 is removed from the top surface 5 of each of the ridges 31 and from the areas of the substrate 1 disposed between the ridges 31. Additionally, portions of the charge-trapping layer 11 disposed beside the ridges 31 and extending above the top surfaces 5 of the ridges 31 are removed.

The removal of the charge-trapping layer 11 may include an anisotropic etch process that selectively etches the charge-trapping layer 11 with regard to the substrate 1. In case the charge-trapping layer 11 comprises a first 27, second 28 and third 29 dielectric layer, each of the dielectric layers 27, 28, 29 may be removed by a separate etch process.

An oxidation step is then performed to encapsulate each of the ridges 31. The oxidation step includes forming a first insulating layer 10 on the top surfaces 5 of each of the ridges 31 and forming a second insulating layer 17 on the areas of the substrate 1 disposed between the ridges 31. Each first insulating layer 10 abuts the top surface 5 of a respective ridge 31 and the charge-trapping layers 11 disposed on the opposed sidewalls 32, 33 of a respective ridge 31. Each second insulating layer 17 abuts charge-trapping layers 11 disposed on facing sidewalls 33, 32' of adjacent ridges 31, 31' and areas of the substrate 1 disposed between the adjacent ridges 31, 31'. First 10 and second 17 insulating layers may comprise silicon oxide.

Figure 4A:
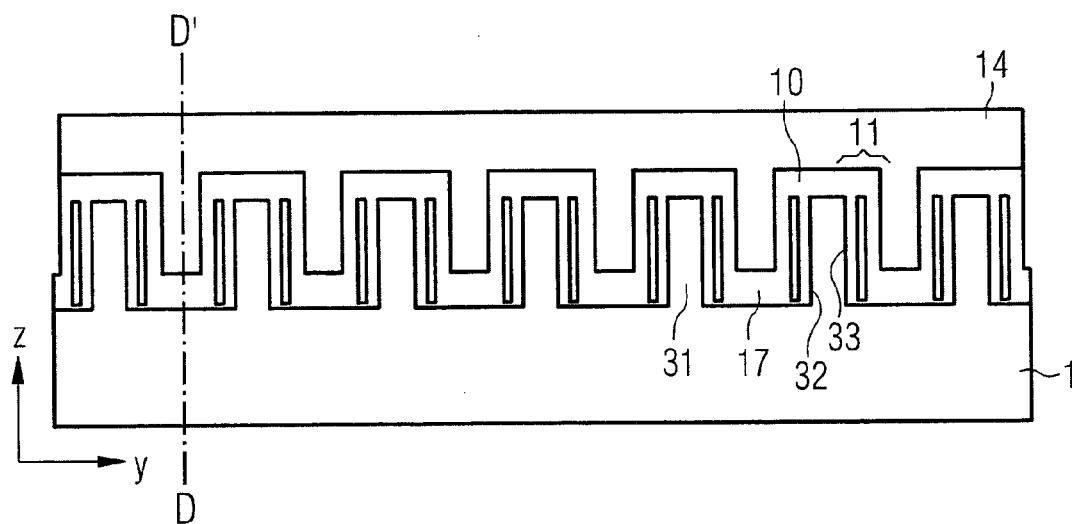
Figure 4B:
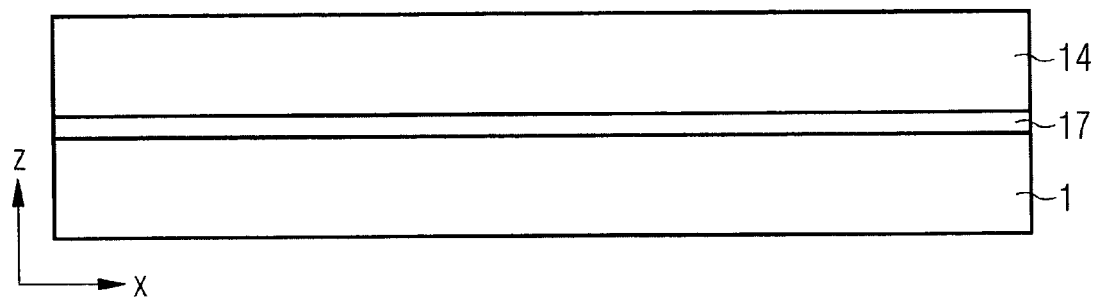

FIG. 4A depicts a cross-sectional view of the semiconductor device as depicted in FIG. 3A in another stage of the production process. FIG. 4B depicts a cross-sectional view of the semiconductor device as depicted in FIG. 4A along the cutting line DD' depicted in FIG. 4A.

Referring to FIGS. 4A and 4B, a first conductive layer 14 is then formed on the first insulating layers 10 disposed on the top surfaces 5 of each of the ridges 31, on each of the second insulating layers 17 disposed on the areas of the substrate 1 between the ridges 31 and on the charge-trapping layers 11 disposed on the first 32 and second 33 sidewalls of each of the ridges 31. The first conductive layer 14 abuts the first insulating layers 10 disposed on the top surfaces 5 of each of the ridges 31, the charge-trapping layers 11 disposed on the opposed sidewalls 32, 33 of each of the ridges 31 and the second insulating layer 17 disposed on the areas of the substrate 1 disposed between the ridges 31. The first conductive layer 14 fills recesses disposed between adjacent ridges 31. The first conductive layer 14 may comprise doped polysilicon.

In a following chemical mechanical polishing step, the surface of the first conductive layer 14 is planarized to reduce the topology. The distance between a top surface of the first conductive layer 14 and a top surface of the substrate 1 is larger than the distance between a top surface of the first insulating layer 10 and the top surface of the substrate 1.

Figure 5A:
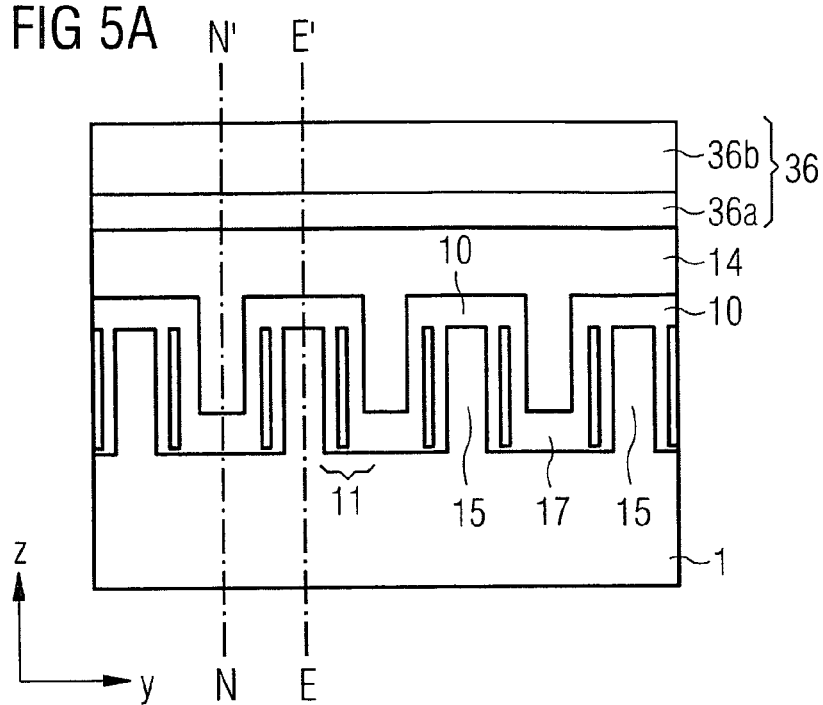
Figure 5B:
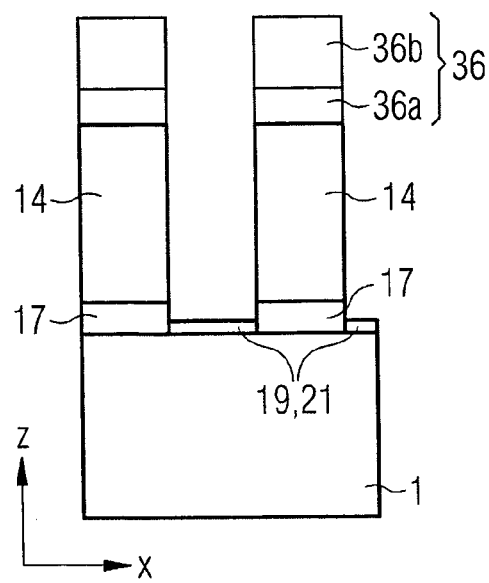
Figure 5C:
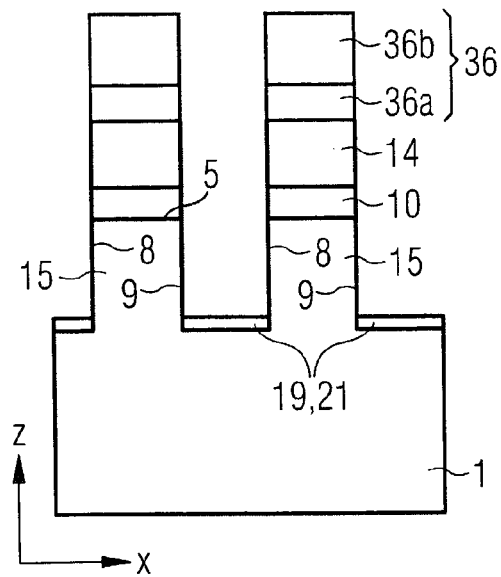

FIG. 5A depicts a cross-sectional view of the semiconductor device as depicted in FIG. 4A in another stage of the production process. FIG. 5B depicts a cross-sectional view of the semiconductor device as depicted in FIG. 5A along the cutting line NN' depicted in FIG. 5A. FIG. 5C depicts a cross-sectional view of the semiconductor device as depicted in FIG. 5A along the cutting line EE' depicted in FIG. 5A.

As depicted in FIGS. 5A, 5B and 5C, a second hardmask 36 is deposited on the first conductive layer 14. The second hardmask 36 comprises a material that can be selectively etched to the underlying first conductive layer 14. The second hardmask 36 may comprise a first 36a, a second 36b and a third (not shown in FIGS. 5A, 5B, 5C) mask layer. The third mask layer (not shown in FIGS. 5A, 5B, 5C) may comprise a material that can be selectively etched with regard to the second mask layer 36b. The second mask layer 36b may comprise a material that can be selectively etched with regard to the underlying first mask layer 36a. The first mask layer 36a may comprise a material that can be selectively etched with regard to the underlying first conductive layer 14. The first mask layer 36a may comprise silicon nitride, the second mask layer 36b may comprise carbon and the third mask layer (not shown in FIGS. 5A, 5B, 5C) may comprise silicon oxy nitride.

Referring to FIGS. 5B and 5C, the third mask layer (not shown in FIGS. 5A, 5B, 5C) of the second hardmask 36 is patterned by means of photolithography and a following etch step to create openings of the third mask layer (not shown in FIGS. 5A, 5B, 5C) of the second hardmask 36 extending along the second direction Y. Then the second mask layer 36b is patterned by an etching step using the third mask layer (not shown in FIGS. 5A, 5B, 5C) as a mask to create openings of the second mask layer 36b extending along the second direction Y. In a following etching process, the first mask layer 36a is patterned using the second mask layer 36b as a mask to create openings of the first mask layer 36a extending along the second direction Y. During this etching process, the third mask layer (not shown in FIGS. 5A, 5B, 5C) is preferably completely removed.

Line-shaped areas of the substrate 1, wherein the line-shaped areas extend along the second direction Y, are then exposed by means of an etching process using the second hardmask 36 as a mask.

The etching process comprises etching of the first conductive layer 14, the first insulating layer 10 disposed on the top surface 5 of each of the ridges 31, the second insulating layer 17 disposed on the areas of the substrate 1 disposed between the ridges 31, the charge-trapping layer 11 and the ridges 31 selectively to the second hardmask 36 along the second direction Y.

As depicted in FIG. 5C, each of the ridges 31 is separated by the etching process into a multitude of fins 15. Each of the fins 15 extends along the first direction X and has first 8 and second 9 opposed ends.

Then line-shaped layers 19, 21 of silicon are formed on each of the exposed line-shaped areas of the substrate 1. The line-shaped layers 19, 21 may be formed by epitaxially depositing silicon on the exposed line-shaped areas of the substrate 1.

As depicted in FIG. 5B, each line-shaped layer 19, 21 abuts adjacent second insulating layers 17. Top surfaces of each of the line-shaped layers 19, 21 are recessed below top surfaces of the second insulating layers 17. Furthermore, as depicted in FIG. 5C, each line-shaped layer 19, 21 abuts adjacent lower parts of fins 15.

Figure 6A:
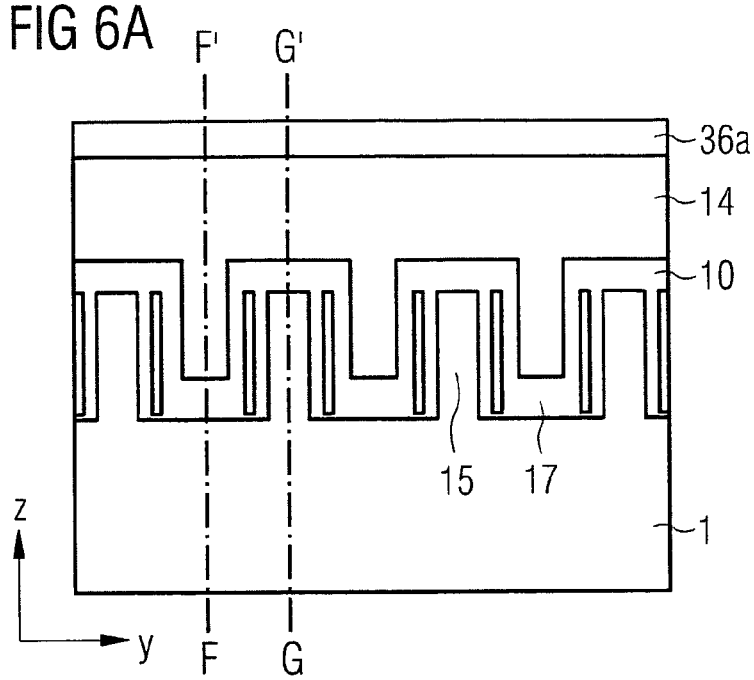
Figure 6B:
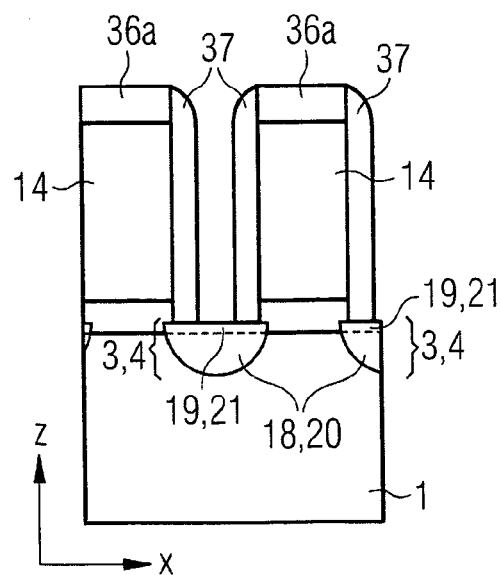
Figure 6C:
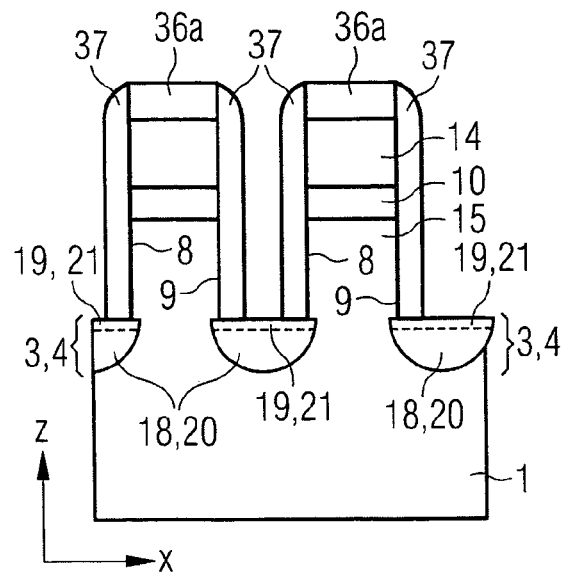

FIG. 6A depicts a cross-sectional view of the semiconductor device as depicted in FIG. 5A in another stage of the production process. FIG. 6B depicts a cross-sectional view of the semiconductor device as depicted in FIG. 6A along the cutting line FF' depicted in FIG. 6A. FIG. 6C depicts a cross-sectional view of the semiconductor device as depicted in FIG. 6A along the cutting line GG' depicted in FIG. 6A.

The second mask layer 36b of the second hardmask 36 is removed by, for example, a plasma process, as shown in FIG. 6B. Then spacers 37 are formed on exposed sidewalls of each second insulating layer 17 and on each exposed sidewall of the first conductive layer 14 disposed on the second insulating layer 17.

Concurrently, as depicted in FIG. 6C, spacers 37 are formed on first 8 and second 9 opposing ends of each of the fins 15, on exposed sidewalls of the first insulating layer 10 disposed on the top surface 5 of each of the fins 15 and on exposed sidewalls of the first conductive layer 14 disposed on the first insulating layer 10.

Forming spacers 37 may comprise the deposition of a spacer material on each of the line-shaped layers 19, 21 and subsequently performing an anisotropic etch process, thereby etching the spacer material selectively to the second hardmask 36 and thereby exposing portions of the line-shaped layer 19, 21. The spacer material may comprise silicon oxide that may be deposited by a plasma enhanced chemical vapor deposition (PECVD) process using, for example, tetra ethyl ortho silicate (TEOS) as a precursor.

First 3 and second 4 conductive lines extending along the Y-direction are then formed by implanting dopants, for example boron atoms, into the line-shaped layers 19, 21, wherein the spacers 37 and the second hardmask 36 prevent dopants from being implanted into the first conductive layer 14. The dopants may also be implanted into portions of the substrate 1 underlying the line-shaped layers 19, 21. The first line 3 may comprise a first doped line-shaped layer 18 disposed in the substrate 1 and a second epitaxially grown doped line-shaped layer 19 disposed on the first line-shaped layer 18. The second line 4 may comprise a first doped line-shaped layer 20 disposed in the substrate 1 and a second epitaxially grown doped line-shaped layer 21 disposed on the first line-shaped layer 20. The first 3 and second 4 lines serve as bitlines of the semiconductor device.

A thermal processing step may be performed to effect diffusion of the dopants below the spacer material towards portions of the substrate 1 disposed in vicinity to the first 8 and second 9 ends of the fins 15 and thereby providing an electrically conductive path between the first lines 3 and the fins 15 and between the second lines 4 and the fins 15.

Figure 7A:
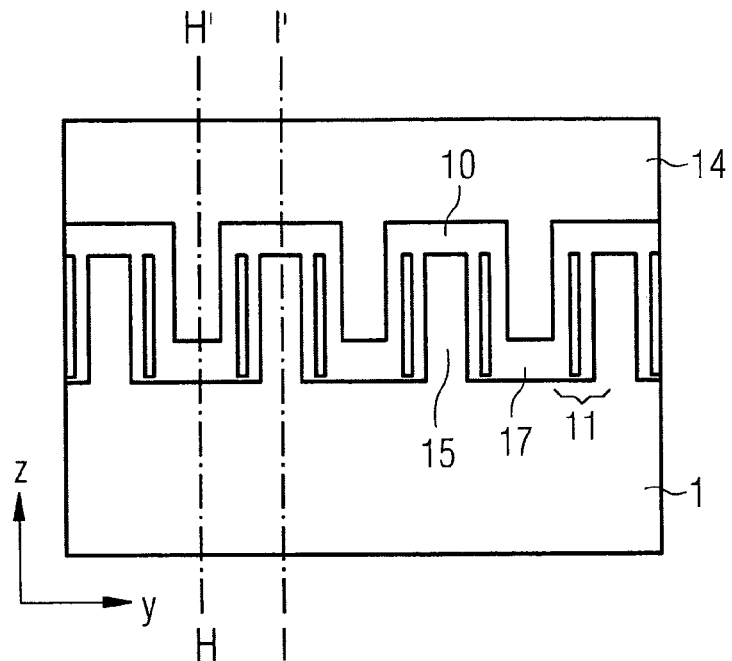
Figure 7B:
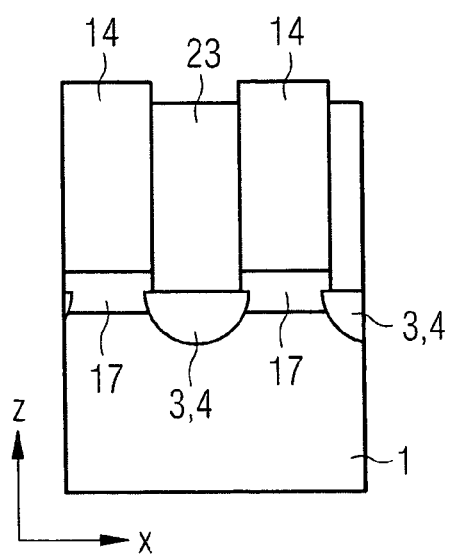
Figure 7C:
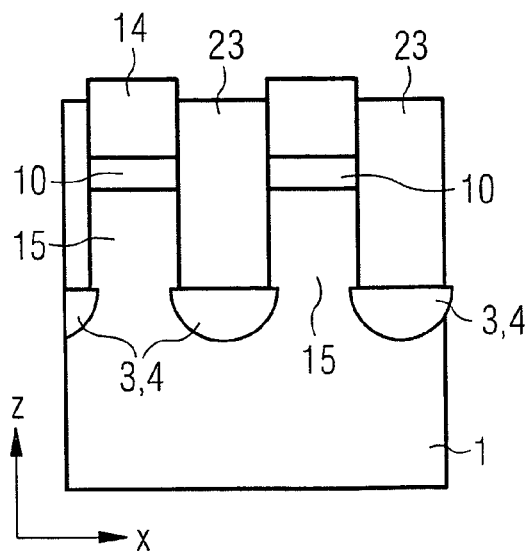

FIG. 7A depicts a cross-sectional view of the semiconductor device as depicted in FIG. 6A in another stage of the production process. FIG. 7B depicts a cross-sectional view of the semiconductor device as depicted in FIG. 7A along the cutting line HH' depicted in FIG. 7A. FIG. 7C depicts a cross-sectional view of the semiconductor device as depicted in FIG. 7A along the cutting line II' depicted in FIG. 7A.

Referring to FIGS. 7B and 7C, isolation fillings 23 are provided on the first 3 and second 4 lines, the isolation fillings 23 filling gaps between the spacers 37 (not shown in FIGS. 7B and 7C). Both, the isolation fillings 23 and the second insulating layers 17, provide electrical isolation between the first conductive layer 14 and the first line 3 and between the first conductive layer 14 and the second line 4.

The isolation fillings 23 may comprise silicon oxide that may be deposited by a plasma enhanced chemical vapor deposition (PECVD) process using TEOS as precursor. The isolation fillings 23 are then etched back by, for example, a chemical mechanical polishing (CMP) process, using the first mask layer 36a of the second hardmask 36 (not depicted in FIGS. 7B and 7C) as an etch stop layer. The first mask layer 36a of the second hardmask 36 (not depicted in FIGS. 7B and 7C) is then removed and top surfaces of the isolation fillings 23 are recessed below top surfaces of the first conductive layers 14 by a deglaze process.

Figure 8A:
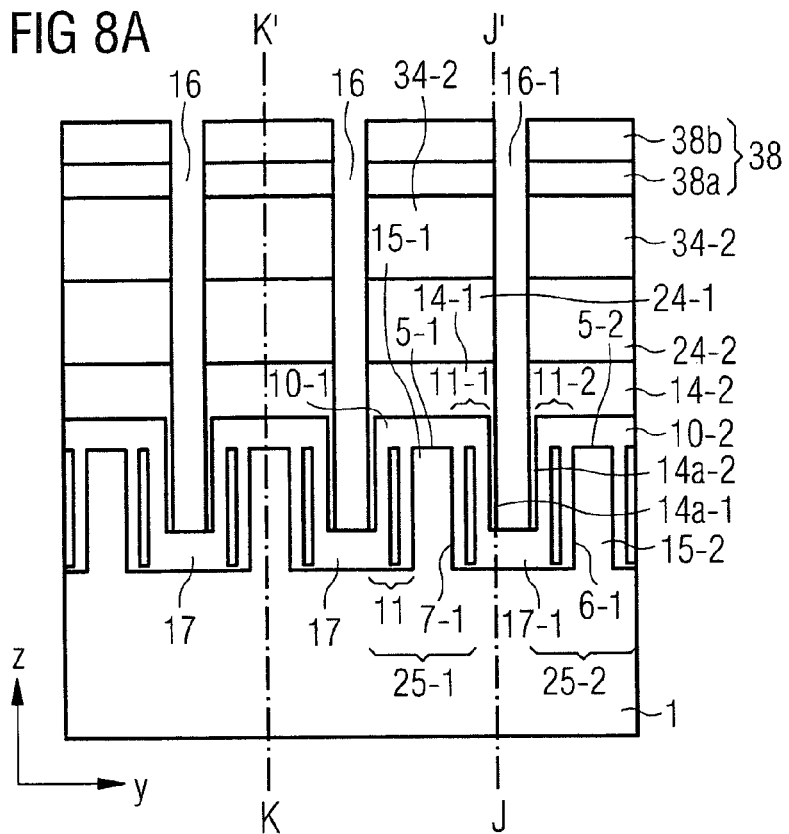
Figure 8B:
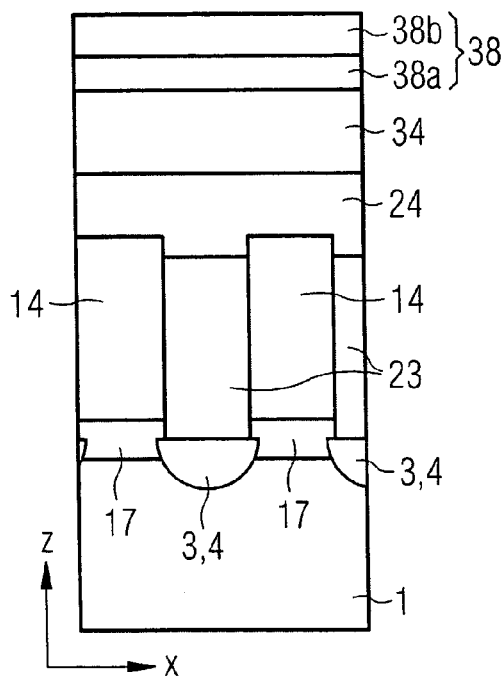
Figure 8C:
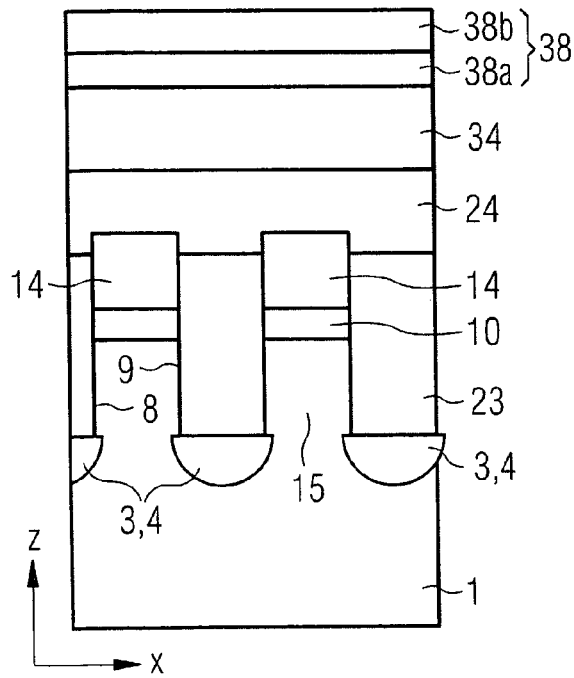

FIG. 8A depicts a cross-sectional view of the semiconductor device as depicted in FIG. 7A in another stage of the production process. FIG. 8B depicts a cross-sectional view of the semiconductor device as depicted in FIG. 8A along the cutting line JJ' depicted in FIG. 8A. FIG. 8C depicts a cross-sectional view of the semiconductor device as depicted in FIG. 8A along the cutting line KK' depicted in FIG. 8A.

Referring to FIGS. 8A, 8B and 8C, a continuous second conductive layer 24 is deposited, the second conductive layer 24 covering the top surfaces of the isolation fillings 23 and the top surfaces of the first conductive layers 14. The second conductive layer 24 may comprise polysilicon. Next a third conductive layer 34 is formed on the second conductive layer 24, wherein the third conductive layer 34 may comprise a metal, preferably tantalum.

A third hardmask 38 is deposited on the third conductive layer 34. The third hardmask 38 may comprise a first mask layer 38a, a second mask layer 38b and a third mask layer (not shown in FIGS. 8A, 8B, 8C). The third mask layer (not shown in FIGS. 8A, 8B, 8C) may comprise a material that can be selectively etched with regard to the underlying second mask layer 38b. The second mask layer 38b may comprise a material that can be selectively etched with regard to the underlying first mask layer 38a. The first mask layer 38a may comprise a material that can be selectively etched with regard to the underlying third conductive layer 34. The first mask layer 38a may comprise silicon nitride, the second mask layer 38b may comprise carbon and the third mask layer (not shown in FIGS. 8A, 8B, 8C) may comprise silicon oxy nitride.

Referring to FIGS. 8A, 8B, 8C, the third mask layer (not shown in FIGS. 8A, 8B, 8C) is patterned by means of photo-lithography and a following etch step to create openings of the third mask layer (not shown in FIGS. 8A, 8B, 8C) of the third hardmask 38 extending along the X-direction. Then the second mask layer 38b is patterned by an etching step using the third mask layer (not shown in FIGS. 8A, 8B, 8C) as a mask to create openings of the second mask layer 38b extending along the X-direction. In a following etch process, the first mask layer 38a is patterned using the second mask layer 38b as a mask to create openings of the first mask layer 38a extending along the X-direction. During this etching process, the third mask layer (not shown in FIGS. 8A, 8B, 8C) of the third hardmask 38 is preferably completely removed.

Then, the patterned third hardmask 38 is used as a mask layer to form isolation trenches 16 extending along the X-direction and having a distance from each other. The isolation trenches 16 are formed between charge-trapping layers 11-1, 11-2 disposed on facing sidewalls 7-1, 6-2 of fins 15-1, 15-2 adjacent to one another. Forming of each of the isolation trenches 16 comprises selectively etching and removing portions of the third conductive layer 34, portions of the second conductive layer 24 and portions of the first conductive layer 14. As depicted in FIG. 8A, the isolation trench 16-1 separates the second conductive layer 24 into stripes of second conductive layers 24-1, 24-2 extending along the X-direction. The isolation trench 16-1 further separates the third conductive layer 34 into stripes of third conductive layers 34-1, 34-2 extending along the X-direction.

By the etching process, single memory cells 25-1, 25-2 are formed. Each of the memory cells 25-1, 25-2 comprises a fin 15-1, 15-2 extending along the X-direction, wherein the fins 15-1, 15-2 each have a top surface 5-1, 5-2, opposed sidewalls 6, 7 and first 8 and second 9 opposed ends. A first insulating layer 10-1, 10-2 is disposed on the top surfaces 5-1, 5-2 of each of the fins 15-1, 15-2, a charge-trapping layer 11 is disposed on opposed sidewalls 6, 7 of each of the fins 15-1, 15-2 and a patterned, first conductive layer 14-1, 14-2 covers the first insulating layer 10-1, 10-2 disposed on the top surfaces 5 of each of the fins 15-1, 15-2 and the first conductive layer 14-1, 14-2 covers the charge-trapping layers 11 of each of the fins 15-1, 15-2. The first conductive layers 14-1, 14-2 may serve as gates of the memory cells 25-1, 25-2. Each of the first conductive layer 14-1, 14-2 is coupled to a respective second conductive layer 24-1, 24-2.

As depicted in FIG. 8A, a section 14a-1 of the first conductive layer 14-1 disposed on the first insulating layer 10-1 of the memory cell 25-1 extends into a recess disposed between facing sidewalls 7-1, 6-1 of memory cells 25-1, 25-2 adjacent to one another. The section 14a-1 of the first conductive layer 14-1 abuts the second insulating layer 17-1 disposed between the memory cells 25-1, 25-2 adjacent to one another and the charge-trapping layer 11-1 disposed on the second sidewall 7-1 of the memory cell 25-1.

A section 14a-2 of the first conductive layer 14-2 disposed on the first insulating layer 10-2 of the memory cell 25-2 extends into the recess disposed between the facing sidewalls 7-1, 6-1 of the memory cells 25-1, 25-2 adjacent to one another. The section 14a-2 of the first conductive layer 14-2 abuts the second insulating layer 17-1 disposed between the memory cells 25-1, 25-2 adjacent to one another and the charge-trapping layer 11-2 disposed on the first sidewall 6-1 of the memory cell 25-2.

Figure 9A:
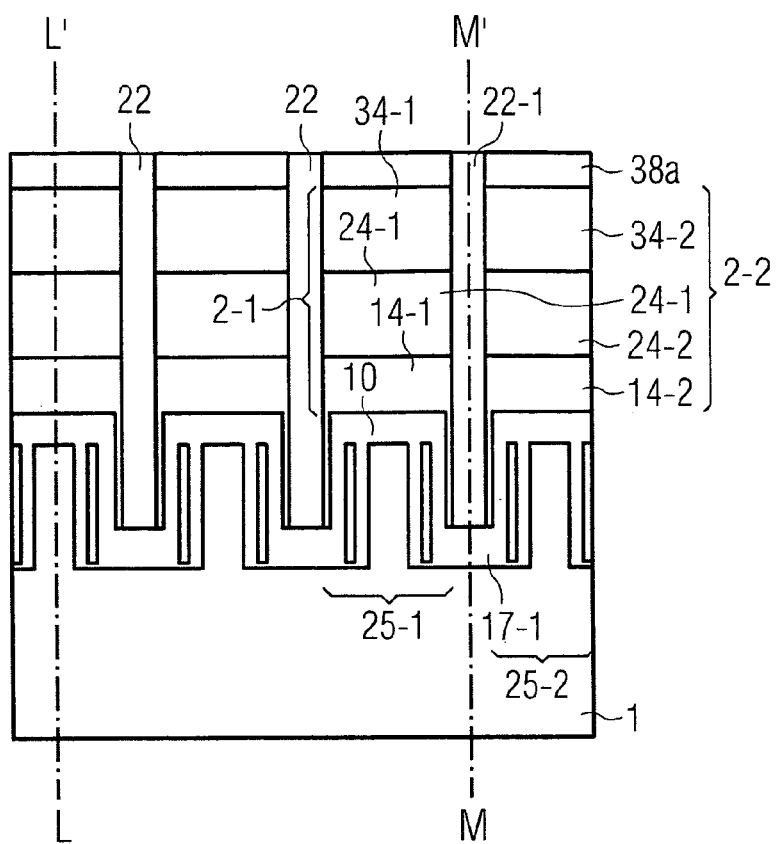
Figure 9B:
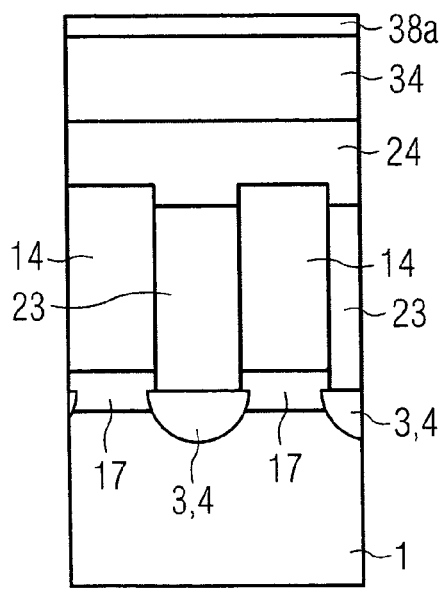
Figure 9C:
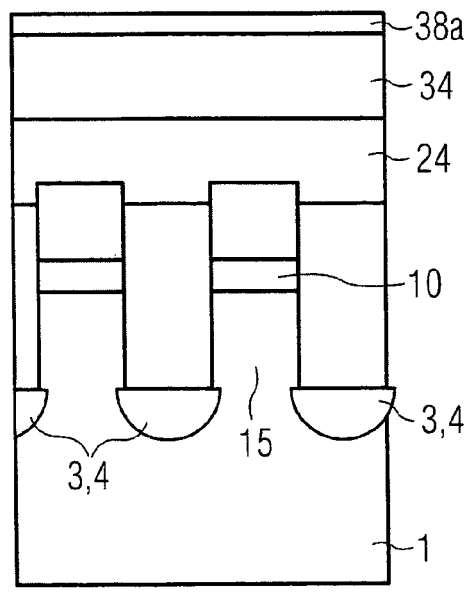

FIG. 9A depicts a cross-sectional view of the semiconductor device as depicted in FIG. 8A in another stage of the production process. FIG. 9B depicts a cross-sectional view of the semiconductor device as depicted in FIG. 9A along the cutting line MM' depicted in FIG. 9A. FIG. 9C depicts a cross-sectional view of the semiconductor device as depicted in FIG. 9A along the cutting line LL' depicted in FIG. 9A.

Referring to FIG. 9A, the second mask layer 38b (not shown in FIG. 9A) of the third hardmask 38 is removed by for example a plasma process. The isolation trenches 16 are then filled with isolation trench fillings 22. The isolation trench filling 22-1 abuts the second insulating layer 17-1 disposed between adjacent memory cells 25-1, 25-2 and the respective first 14-1, 14-2, second 24-1, 24-2 and third 34-1, 34-2 conductive layers.

Wordlines 2-1, 2-2 extending along the X-direction include respective first 14-1, 14-2, second 24-1, 24-2 and third 34-1, 34-2 conductive layers.

The isolation trench fillings 22 comprise, for example, BPSG. Subsequently a CMP process is performed to remove trench isolation filling material from the third hardmask 38, wherein the first mask layer 38a of the hardmask 38 is used as an etch stop layer. The first mask layer 38a of the third hardmask 38 may serve as a cap layer that encapsulates the wordline 2.

Figure 10:
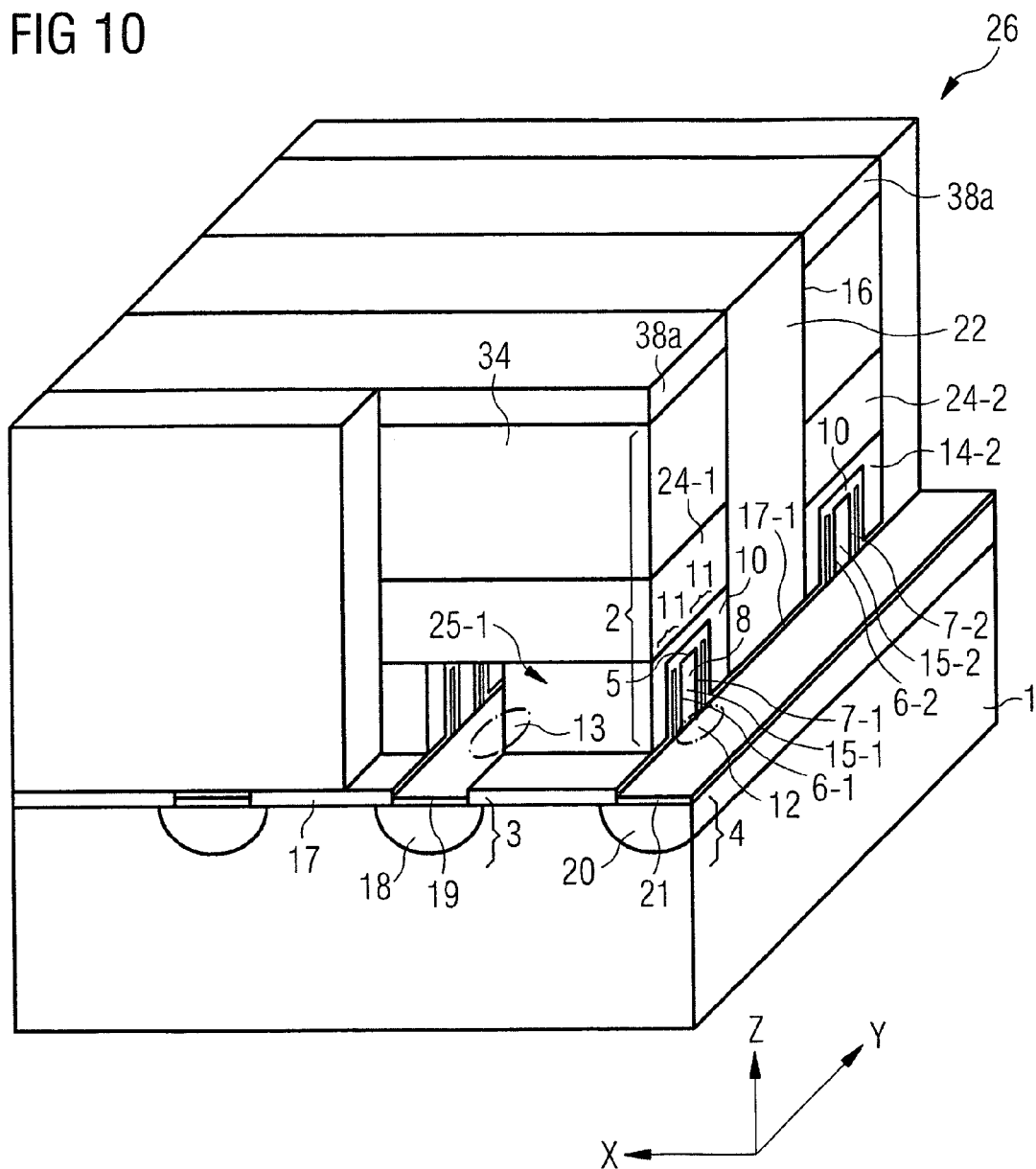
FIG. 10 depicts a three-dimensional view of a semiconductor device according to one embodiment of the present invention.

FIG. 10 depicts a three-dimensional view of a semiconductor memory 26 according to one embodiment of the invention. The semiconductor memory 26 has a substrate 1 and a first 3 and a second 4 line extending along the Y-direction depicted in the coordinate system. The first 3 and the second 4 line are arranged to have a distance from each other. The first 3 and second 4 lines may serve as bitlines of the semiconductor memory 26.

The first line 3 comprises a first line-shaped layer 18 disposed in the substrate 1 and a second line-shaped layer 19 disposed on the first line-shaped layer 18. First 18 and second 19 line-shaped layers may comprise dopants, for example boron atoms.

The second line 4 comprises a first line-shaped layer 20 disposed in the substrate 1 and a second line-shaped layer 21 disposed on the first line-shaped layer 18. First 20 and second 21 line-shaped layers may comprise dopants, for example boron atoms.

A first fin 15-1 and a second fin 15-2 of semiconductor material are disposed on the substrate 1. Each of the fins 15 has a top surface 5, first 6 and second 7 opposing sidewalls and first 8 and second 9 (not shown in FIG. 10) opposed ends.

A first insulating layer 10 is disposed on the top surfaces 5 of each of the fins 15. A charge-trapping layer 11 is disposed on the first 6 and second 7 opposing sidewalls of each of the fins 15. The charge-trapping layer 11 comprises a first dielectric layer 27 disposed on the first 6 and second 7 opposing sidewalls of each of the fins 15, a second dielectric layer 28 disposed on the first dielectric layer 27 and a third dielectric layer 29 disposed on the second dielectric layer 27.

A second insulating layer 17-1 is disposed on areas of the substrate 1 disposed between a second sidewall 7-1 of the first fin 15-1 and a first sidewall 6-2 of the second fin 15-2. A top surface of the first line 3 and a top surface of the second line 4 are recessed below a top surface of the second insulating layer 17-1.

A first patterned conductive layer 14 is disposed on the first insulating layer 10 and on the charge-trapping layer 11 of each of the fins 15. The first conductive layer 14 extends into recesses disposed between adjacent memory cells 25 and abuts the second insulating layer 17. Preferably, the first conductive layer 14 comprises doped polysilicon.

Each of the fins 15 including a respective charge-trapping layer 11, a respective first insulating layer 10 and a respective first conductive layer 14, form a single memory cell 25. A bottom portion of the first end 8 of the fin 15 abuts the first line 3 and a bottom portion of the second end 9 of the fin 15 abuts the second line 4.

A portion of the first line 3 disposed in vicinity to the first end 8 of the fin 15-1 serves as a first doping region 12 of the memory cell 25-1. A portion of the second line 4 disposed in vicinity to the second end 9 (not shown in FIG. 10) serves as a second doping region 13 of the memory cell 25-1. First 12 and second 13 doping regions may serve as source/drain regions of the memory cell 25-1.

A second conductive layer 24 is disposed on each of the first conductive layers 14 and extends along the X-direction. The second conductive layer 24 preferably comprises doped polysilicon.

A third conductive layer 34 is disposed on each of the second conductive layers 24 and extends along the X-direction. The third conductive layer 34 preferably comprises a metal, for example tungsten.

Each first patterned conductive layer 14, the respective second conductive layer 24 and the respective third conductive layer 34 altogether form a wordline 2.

Memory cells 25 and the respective second 24 and third 34 conductive layers are separated with regard to the Y-direction by isolation trenches 16 extending along the X-direction, the isolation trenches 16 being filled with isolation trench fillings 22.

Each of the memory cells 25 is capable of storing at least one bit of information. For programming a memory cell 25-1, a first programming voltage is applied to the wordline 2, thereby forming conductive channels on each sidewall 6-1, 7-1 of the respective fin 15-1. Then, a second programming voltage potential is applied to the second doping region 13, thereby effecting traveling of charges along the channels from the first doping region 12 to the second doping region 13 and thereby inducing tunneling of hot carriers from each of the channels through the respective first dielectric layers 27 into the respective second dielectric layers 28, wherein the charges are trapped in the second dielectric layers 28. Accordingly, charges are locally deposited on each sidewall 6-1, 7-1 of the respective fin 15-1.

FIG. 11 depicts schematically an arrangement of memory cells 25 of a semiconductor memory 26 according to one embodiment of the invention. Wordlines 2-1, 2-2, 2-3 extend along the first direction X. Lines 3-1, 4-0; 3-2, 4-1; 3-3, 4-2 extend along the second direction Y. Each of the wordlines 2-1, 2-2, 2-3 is coupled to a multitude of memory cells 25 arranged along the X-direction. Each line 3-1, 4-0; 3-2, 4-1; 3-3, 4-2 is coupled to a multitude of memory cells 25 arranged along the Y-direction. Line 3-1, 4-0 is the first line of memory cell 25-1 and the second line of a memory cell 25-0 (not shown in FIG. 11). Line 3-2, 4-1 is the second line of memory cell 25-1 and the first line of memory cell 25-2. Accordingly, memory cells 25 adjacent to one another with regard to the X-direction share a common line extending along the second direction Y.

Each wordline 2-1, 2-2, 2-3 is coupled to respective charge-trapping layers 11 disposed on opposed sidewalls of fins 15 (not shown in FIG. 11) of memory cells 25-1, 25-2.

The line 3-2, 4-1 is coupled to the second end of the fin (not shown in FIG. 11) of the memory cell 25-1 and the first end of the fin (not shown in FIG. 11) of the memory cell 25-2.

What is claimed is:

1. A semiconductor memory device having a plurality of memory cells, said semiconductor memory device having a substrate, at least one wordline and first and second lines, wherein each memory cell of said plurality of memory cells comprises:

a fin of semiconductor material, said fin having a top surface, first and second opposing sidewalls and first and second opposing ends, said fin extending along a first direction;

channel regions in the first and second sidewalls of the fins, wherein the channel regions extends from the first end to the second end of the fin;

a charge-trapping layer disposed adjacent said channel regions of said first and second sidewalls of said fin, wherein the charge-trapping layer is not disposed on said top surface of said fin;

a patterned first insulating layer disposed on said top surface of said fin, said first insulating layer abutting said top surface of said fin and said charge-trapping layer;

a first doped region coupled to said first end of said fin; and a second doped region coupled to said second end of said fin;

wherein said at least one wordline covers said first insulating layer disposed on said top surface of said fin and said at least one wordline covers said charge-trapping layer disposed on said first and second sidewalls of said fin, and said at least one wordline extends along said first direction; and wherein said first and second lines extend along a second direction.

2. The semiconductor memory device of claim 1, wherein said first line includes said first doped region and said second line including said second doped region.

3. The semiconductor memory device of claim 2, wherein said at least one wordline comprises a first conductive layer covering said first insulating layer disposed on said top surface of said fin, said first conductive layer further covers said charge-trapping layer disposed on said first and second sidewalls of said fin, a section of said first conductive layer extending into said recesses disposed between facing sidewalls of memory cells adjacent to one another, said section of said first conductive layer abutting said second insulating layer and said charge-trapping layer.

4. The semiconductor memory device of claim 3, further comprising isolation trenches filled with trench isolation filling, said isolation trenches extending along said first direction and said isolation trenches extending into said recesses disposed between said facing sidewalls of memory cells adjacent to one another and said trench isolation fillings abutting said section of said first conductive layer extending into said recesses, said wordline and said second insulating layer.

5. The semiconductor memory device of claim 4, further comprising isolation fillings disposed on said first and second lines, said isolation fillings abutting said first conductive layer, said first and second ends of said fins, said first insulating layer, said second insulating layer, said trench isolation filling and said charge-trapping layer.

6. The semiconductor memory device of claim 5, wherein said isolation fillings comprise silicon oxide.

7. The semiconductor memory device of claim 4, wherein said trench isolation fillings comprise borophosphosilicate glass.

8. The semiconductor memory device of claim 3, wherein said first conductive layer comprises doped polysilicon.

9. The semiconductor memory device of claim 1, further comprising a second insulating layer and a recess disposed between facing sidewalls of memory cells adjacent to one another, said second insulating layer covering portions of said substrate, said portions being disposed between fins adjacent to one another.

10. The semiconductor memory device of claim 9, wherein said second insulating layer comprises silicon oxide.

11. The semiconductor memory device of claim 1, wherein said charge-trapping layer comprises a first dielectric layer, a second dielectric layer disposed on the first dielectric layer and a third dielectric layer disposed on the second dielectric layer.

12. The semiconductor memory device of claim 11, wherein said first dielectric layer and said third dielectric layer each comprise a material selected from the group consisting of silicon oxide, aluminum oxide and tantalum pentoxide and wherein said second dielectric layer comprises a material selected from the group consisting of silicon nitride and silicon oxy-nitride.

13. The semiconductor memory device of claim 1, wherein said first insulating layer comprises silicon oxide.

14. The semiconductor memory device of claim 1, wherein said first line and second line each comprise phosphorous.

15. A semiconductor memory device having a plurality of memory cells, said semiconductor memory device having a substrate, at least one wordline and first and second lines, wherein each memory cell of said plurality of memory cells comprises:

a fin of semiconductor material, said fin having a top surface, first and second opposing sidewalls and first and second opposing ends, said fin extending along a first direction;

a charge-trapping layer disposed on said first and second sidewalls of said fin;

a patterned first insulating layer disposed on said top surface of said fin, said first insulating layer abutting said top surface of said fin and said charge-trapping layer;

a first doped region coupled to said first end of said fin; and a second doped region coupled to said second end of said fin;

wherein said at least one wordline covers said first insulating layer disposed on said top surface of said fin and said at least one wordline covers said charge-trapping layer disposed on said first and second sidewalls of said fin, and said at least one wordline extends along said first direction;

wherein said first and second lines extend along a second direction;

wherein said first line comprises a first doped line-shaped layer disposed in said substrate and a second epitaxially grown doped line-shaped layer disposed over said first line-shaped layer; and wherein said second line comprises a second doped line-shaped layer disposed in said substrate and a second epitaxially grown doped line-shaped layer disposed over said first line-shaped layer.

16. The semiconductor memory device of claim 15, wherein said wordline further comprises a second conductive layer extending along said first direction and abutting a top surface of a first conductive layer, a top surface of said isolation filling and said trench isolation filling.

17. The semiconductor memory device of claim 16, wherein said wordline further comprises a third conductive layer disposed on said second conductive layer and extending along said first direction, said third conductive layer abutting trench isolation fillings adjacent to one another.

18. The semiconductor memory device of claim 17, further comprising a cap layer extending along said first direction, said cap layer covering said third conductive layer and abutting said isolation trench fillings adjacent to one another.

19. The semiconductor memory device of claim 18, wherein said cap layer comprises silicon nitride.

20. The semiconductor memory device of claim 17, wherein said third conductive layer comprises a metal.

21. The semiconductor memory device of claim 20, wherein said metal comprises at least tungsten.

22. The semiconductor memory device of claim 16, wherein said second conductive layer comprises doped polysilicon.

23. The semiconductor memory device of claim 15, wherein:
- said second line-shaped layer of said first line has a top surface that is recessed below said top surface of a second insulating layer; and
- said second line-shaped layer of said second line has a top surface that is recessed below said top surface of said second insulating layer.

24. A semiconductor memory device having a plurality of memory cells, said semiconductor memory device having a substrate, at least one wordline and first and second lines, wherein each memory cell of said plurality of memory cells comprises:
- a fin of semiconductor material, said fin having a top surface, first and second opposing sidewalls and first and second opposing ends, said fin extending along a first direction;
- a charge-trapping layer disposed on said first and second sidewalls of said fin;
- a patterned first insulating layer disposed on said top surface of said fin, said first insulating layer abutting said top surface of said fin and said charge-trapping layer;
- a first doped region coupled to said first end of said fin; and
- a second doped region coupled to said second end of said fin;
- wherein said at least one wordline covers said first insulating layer disposed on said top surface of said fin and said at least one wordline covers said charge-trapping layer disposed on said first and second sidewalls of said fin, and said at least one wordline extends along said first direction;
- wherein said first and second lines extend along a second direction; and
- wherein said substrate further comprises line-shaped areas comprising dopants, said line-shaped areas extending along said first direction and being disposed between adjacent fins.

25. The semiconductor memory device of claim 24, wherein said dopants include boron.

26. A memory cell disposed on a substrate, said memory cell comprising:
- a fin of semiconductor material, said fin having a top surface, first and second opposing sidewalls, and first and second opposing ends, said fin extending along a first direction;
- channel regions in the first and second sidewalls of the fin, wherein the channel regions extends from the first end to the second end of the fin;
- a charge-trapping layer disposed on said channel regions of said first and second sidewalls of said fin, wherein the charge-trapping layer is not disposed on said top surface of said fin;
- a patterned insulating layer disposed on said top surface of said fin, said insulating layer abutting said top surface of said fin and said charge-trapping layer;
- a patterned conductive layer covering said insulating layer disposed on said top surface of said fin and said conductive layer covering said charge-trapping layer disposed on said first and second sidewalls of said fin.

27. The memory cell of claim 26, wherein said charge-trapping layer comprises a first dielectric layer, a second dielectric layer disposed over the first dielectric layer and a third dielectric layer disposed over the second dielectric layer.

28. The memory cell of claim 26, wherein said first dielectric layer and said third dielectric layer each comprise a material selected from the group consisting of silicon oxide, aluminum oxide and tantalum pent-oxide and wherein said second dielectric layer comprises a material selected from the group consisting of silicon nitride and silicon oxy-nitride.

29. The memory cell of claim 26, wherein said insulating layer comprises silicon oxide.

30. The memory cell of claim 26, wherein said conductive layer comprises doped polysilicon.

* * * * *